(12) United States Patent
Zhang et al.

(10) Patent No.: US 10,935,857 B2
(45) Date of Patent: Mar. 2, 2021

(54) ARRAY SUBSTRATE, MANUFACTURING METHOD THEREOF, AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Sichuan (CN)

(72) Inventors: Guolin Zhang, Beijing (CN); Jiuyang Cheng, Beijing (CN); Jiahong Zou, Beijing (CN); Wenhao Xiao, Beijing (CN); Junliang Li, Beijing (CN); Yihong Ma, Beijing (CN)

(73) Assignees: BOE TECHNOLOGY GROUP CO., LTD., Beijing (CN); CHENGDU BOE OPTOELECTRONICS TECHNOLOGY CO., LTD., Sichuan (CN)

( * ) Notice: Subject to any disclaimer, the term of this patent is extended or adjusted under 35 U.S.C. 154(b) by 364 days.

(21) Appl. No.: 16/082,709

(22) PCT Filed: Jan. 25, 2018

(86) PCT No.: PCT/CN2018/074131
§ 371 (c)(1),
(2) Date: Sep. 6, 2018

(87) PCT Pub. No.: WO2019/015291
PCT Pub. Date: Jan. 24, 2019

(65) Prior Publication Data
US 2020/0379307 A1     Dec. 3, 2020

(30) Foreign Application Priority Data

Jul. 21, 2017   (CN) .......................... 201710601282.4

(51) Int. Cl.
*H01L 27/14* (2006.01)
*G02F 1/1362* (2006.01)
(Continued)

(52) U.S. Cl.
CPC ...... *G02F 1/136286* (2013.01); *G02F 1/1368* (2013.01); *G02F 1/133345* (2013.01);
(Continued)

(58) Field of Classification Search
CPC ............ H01L 27/1244; H01L 27/1248; H01L 27/3216; H01L 27/3246; H01L 27/3262;
(Continued)

(56) References Cited

U.S. PATENT DOCUMENTS

| | | |
|---|---|---|
| 2011/0299024 A1 | 12/2011 | Lee et al. |
| 2015/0102353 A1 | 4/2015 | Wang et al. |
| 2018/0095334 A1* | 4/2018 | Zang ................. G02F 1/136286 |

FOREIGN PATENT DOCUMENTS

| | | |
|---|---|---|
| CN | 103969865 A | 8/2014 |
| CN | 104765195 A | 7/2015 |

(Continued)

OTHER PUBLICATIONS

International Search Report and Written Opinion dated Apr. 20, 2018; PCT/CN2018/074131.

*Primary Examiner* — Brook Kebede

(57) ABSTRACT

The present disclosure provides an array substrate, a manufacturing method of an array substrate, and a display device. The array substrate includes: a base substrate; a first signal line, extending in a first direction and located on the base substrate; a second signal line, extending in a second direction and located on a side of the first signal line away from the base substrate and insulated with the first signal line, the first direction and the second direction crossing with each other. A side of the first signal line facing the second signal (Continued)

line is provided with a groove, the groove is located at a crossing region between the first signal line and the second signal line, in the crossing region, an otherographic projection of the second signal line on the base substrate completely falls into an orthographic projection of the groove on the base substrate.

17 Claims, 2 Drawing Sheets

(51) Int. Cl.
  *G02F 1/1368* (2006.01)
  *G02F 1/1333* (2006.01)
  *H01L 27/12* (2006.01)

(52) U.S. Cl.
  CPC ...... *H01L 27/1244* (2013.01); *H01L 27/1248* (2013.01); *H01L 27/1288* (2013.01); *G02F 2001/136295* (2013.01)

(58) Field of Classification Search
  CPC ............. H01L 27/3265; H01L 27/3276; H01L 51/5012; G02F 1/136286; G02F 1/133345; G02F 1/1368; G09G 3/3225; G09G 3/3266
  USPC .......................................................... 257/72
  See application file for complete search history.

(56) References Cited

FOREIGN PATENT DOCUMENTS

| | | | |
|---|---|---|---|
| CN | 106328715 A | 1/2017 | |
| CN | 205881903 U | 1/2017 | |
| WO | WO-2015081659 A1 * | 6/2015 | ....... G02F 1/134309 |

* cited by examiner

ARRAY SUBSTRATE, MANUFACTURING METHOD THEREOF, AND DISPLAY DEVICE

CROSS REFERENCE OF RELATED APPLICATIONS

The present application claims priority of China Patent application No. 201710601282.4 filed on Jul. 21, 2017, the content of which is incorporated in its entirety as portion of the present application by reference herein.

TECHNICAL FIELD

At least one embodiment of the present disclosure relates to an array substrate, a manufacturing method thereof, and a display device.

BACKGROUND

At present, thin film transistor liquid crystal display (TFT-LCD) which has the dominant position in flat panel display market is a display that needs to rely on a backlight for display. The main structure of the display includes an array substrate, a liquid crystal layer, and a color filter substrate, and the array substrate can determine the resolution and viewing angle of the thin film transistor liquid crystal display.

SUMMARY

At least one embodiment of the present disclosure provides an array substrate including: a base substrate; a first signal line extending in a first direction on the base substrate; and a second signal line extending in a second direction, located at a side of the first signal line away from the base substrate, and insulated from the first signal line, and the first direction and the second direction crossing with each other. A side of the first signal line facing the second signal line is provided with a groove, and the groove is located at a crossing region between the first signal line and the second signal line, at the crossing region, an orthographic projection of the second signal line on the base substrate completely falls into an orthographic projection of the groove on the base substrate.

For example, in the array substrate provided by an embodiment of the present disclosure, the first signal line further includes a first portion and a second portion which are located on two sides of the groove, the first portion includes a first connection portion connected with the groove, and the second portion includes a second connection portion connected with the groove, in the second direction, a maximum size of the groove is greater than a size of at least one selected from the group consisting of the first connection portion and the second connection portion.

For example, in the array substrate provided by an embodiment of the present disclosure, the array substrate further includes: a first insulating layer, located between the first signal line and the second signal line.

For example, in the array substrate provided by an embodiment of the present disclosure, the array substrate further includes: a second insulating layer, located between the first signal line and the second signal line. An orthographic projection of the second insulating layer on the base substrate and an orthographic projection of the groove on the base substrate are completely overlapped, in a direction perpendicular to the base substrate, a thickness of the second insulating layer is equal to a depth of the groove, so as to compensate a height difference between a surface of the first signal line or the first insulating layer away from the base substrate and the base substrate due to the groove.

For example, in the array substrate provided by an embodiment of the present disclosure, the second insulating layer is located between the first insulating layer and the first signal line, or between the first insulating layer and the second signal line.

For example, in the array substrate provided by an embodiment of the present disclosure, in a direction perpendicular to the substrate, a ratio of a depth of the groove and a thickness of a portion of the first signal line excluding the groove is less than 1:2.

For example, in the array substrate provided by an embodiment of the present disclosure, one of the first signal line and the second signal line is a scanning line, and the other one of the first signal line and the second signal line is a data line.

At least one embodiment of the present disclosure provides a manufacturing method of an array substrate, including: forming a first signal line extending in a first direction on a substrate; forming a groove on a side of the first signal line away from the base substrate; forming a second signal line extending in a second direction above the first signal line. The second signal line and the first signal line are insulated from each other, the first direction and the second direction cross with each other, the groove is located at a crossing region between the first signal line and the second signal line, at the crossing region, an orthographic projection of the second signal line on the base substrate completely falls into an orthographic projection of the groove on the base substrate.

For example, in the manufacturing method of the array substrate provided by an embodiment of the present disclosure, forming the groove includes: forming a first insulating layer on the first signal line; etching the first insulating layer at the crossing region to form a via hole to expose the first signal line; and etching an exposed portion of the first signal line to form the groove.

For example, in the manufacturing method of the array substrate provided by an embodiment of the present disclosure, before forming the second signal line, the manufacturing method further includes: filling the groove and the via hole with an insulating material. The groove is filled with the insulating material to form a second insulating layer, a surface of the second insulating layer is flushed with a surface of the first signal line, and the via hole is filled with the insulating material to make a thickness of the first insulating layer uniform.

For example, in the manufacturing method of the array substrate provided by an embodiment of the present disclosure, forming the groove includes: forming a photoresist pattern on the first signal line; and etching the first signal line by using the photoresist pattern as a mask to form the groove.

For example, in the manufacturing method of the array substrate provided by an embodiment of the present disclosure, the first signal line and the groove are patterned by one mask plate and formed by a half tone mask process.

For example, in the manufacturing method of the array substrate provided by an embodiment of the present disclosure, before forming the second signal line, the manufacturing method further includes: filling the groove with an insulating material to form a second insulating layer, a surface of the second insulating layer being flushed with a surface of the first signal line; and forming a first insulating layer on the first signal line and the second insulating layer.

For example, in the manufacturing method of the array substrate provided by an embodiment of the present disclosure, before forming the second signal line, the manufacturing method further includes: forming a first insulating layer on the first signal line, a portion of the first insulating layer which is located at the groove being formed as a concave portion; and filling the concave portion with an insulating material to form a second insulating layer, a surface of the second insulating layer being flushed with a surface of the first insulating layer.

For example, in the manufacturing method of the array substrate provided by an embodiment of the present disclosure, the first signal line further includes a first portion and a second portion which are located on two sides of the groove, and the first portion includes a first connection portion connected with the groove, the second portion includes a second connection portion connected with the groove, forming the first signal line includes: patterning the first signal line to make a maximum size of the first signal line at a position where the groove is to be formed greater than a size of at least one selected from the group consisting of the first connection portion and the second connection portion in the second direction.

For example, in the manufacturing method of the array substrate provided by an embodiment of the present disclosure, in a direction perpendicular to the substrate, a ratio of a depth of the groove and a thickness of a portion of the first signal line excluding the groove is less than 1:2.

At least one embodiment of the present disclosure provides a display device including the array substrate provided in any one of the above embodiments.

BRIEF DESCRIPTION OF THE DRAWINGS

In order to clearly illustrate the technical solution of embodiments of the present disclosure, the drawings of the embodiments will be briefly described in the following, it is obvious that the drawings in the description are only related to some embodiments of the present disclosure and not limited to the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. "On," "under," "right." "left" and the like are only used to indicate relative position relationship, and when the position of the object which is described is changed, the relative position relationship may be changed accordingly.

Figure 1:
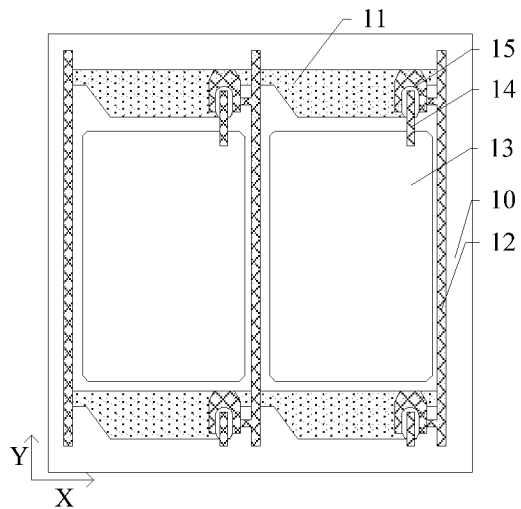
FIG. 1 is a partial schematic diagram of an array substrate.

FIG. 1 is a partial schematic diagram of an array substrate. As illustrated by FIG. 1, the array substrate includes a gate line 11 on the base substrate 10, and a data line 12 on a side of the gate line 11 away from the base substrate 10, and an insulating layer (not shown in FIG. 1) provided between the data line 12 and the gate line 11 to insulate the two from each other.

The gate line 11 and the data line 12 cross each other to define a pixel unit in which the pixel electrode 13 is disposed. The array substrate further includes a thin film transistor including a gate electrode, a source electrode 15 and a drain electrode 14, the gate line 11 is connected with the gate electrode to control opening and closing of the thin film transistor, the data line 12 is connected with the source electrode 15, and the pixel electrode 13 is connected with the drain electrode 14, and the data line 12 inputs a voltage signal required for displaying an image to the pixel electrode 13 through the thin film transistor to achieve displaying of a display panel including the array substrate.

In the study, inventor(s) of the present disclosure notices that: in a process for manufacturing an array substrate, due to the instability of the equipment and the influence of the environment, it is easy for the array substrate to have defects, thereby affecting the quality of the thin film transistor liquid crystal display. A common defect is the short circuit (i.e., Data Gate Short, DGS) phenomenon occurring at a crossing region between the data line and the gate line. So far, the way to reduce the chances of DGS is mainly relying on the improvement of the environment, which cannot prevent the occurrence of DGS from the source.

Embodiments of the present disclosure provide an array substrate, a manufacturing method thereof, and a display device. The array substrate includes: a base substrate; a first signal line extending in a first direction on the base substrate; a second signal line extending in a second direction, and located on a side of the first signal line away from the base substrate and insulated with the first signal line, the first direction and the second direction crossing with each other. A side of the first signal line facing the second signal line is provided with a groove, and the groove is located at a crossing region between the first signal line and the second signal line, at the crossing region, an orthographic projection of the second signal line on the base substrate completely falls into an orthographic projection of the groove on the base substrate. In the array substrate provided by the embodiments of the present disclosure, a thickness of the first signal line at the crossing region between the first signal line and the second signal line is reduced, that is, a groove is disposed in the first signal line at the crossing region between the first signal line and the second signal line, so as to increase a distance between the first signal line and the second signal line at the crossing region, thereby increasing a thickness of an insulating layer at the crossing region between the first signal line and the second signal line without increasing a thickness of the array substrate. The array substrate effectively reduces a risk of short circuit between the first signal line and the second signal line, improves a product yield, and reduces the costs without affecting the performance of the array substrate.

Hereinafter, the array substrate, the manufacturing method of the array substrate, and the display device provided by the embodiments of the present disclosure will be described with reference to the accompanying drawings.

Figure 2:
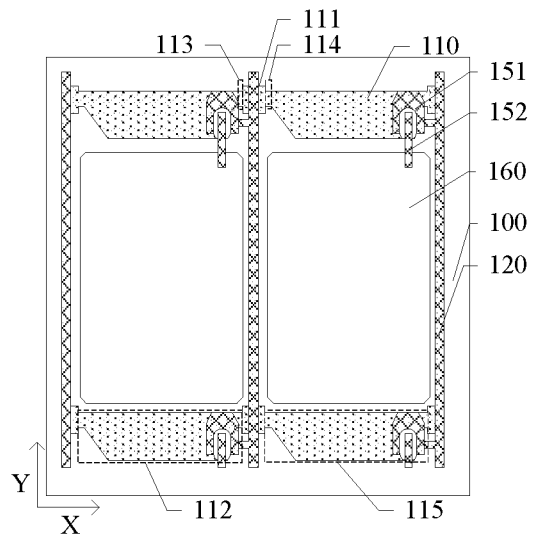
FIG. 2 is a partial schematic diagram of an array substrate provided by an embodiment of the present disclosure.

An embodiment of the present disclosure provides an array substrate. FIG. 2 is a partial schematic view of an array substrate provided by an embodiment of the present disclosure. As illustrated by FIG. 2, the array substrate includes: a base substrate 100; a first signal line 110 extending in a first direction, that is, an X direction, and a second signal line 120 extending in a second direction, that is, a Y direction which are located on the base substrate 100. The second signal line 120 is located on a side of the first signal line 110 away from the base substrate 100 and insulated with the first signal line 110, the first direction and the second direction cross with each other. The present embodiment is described by taking a case where the X direction and the Y direction are perpendicular to each other as an example, but is not limited thereto. In the present embodiment, the groove 111 is disposed on a side of the first signal line 110 facing the second signal line 120, as illustrated by FIG. 2, the groove 111 is located at a crossing region between the first signal line 110 and the second signal line 120. At the crossing region, an orthographic projection of the second signal line 120 on the base substrate 100 completely falls into an orthographic projection of the groove 111 on the base substrate 100. In the array substrate provided in the present embodiment, a thickness of the first signal line at the crossing region between the first signal line and the second signal line is reduced, that is, the groove is disposed in the first signal line at the crossing region between the first signal line and the second signal line, so as to increase a distance between the first signal line and the second signal line at the crossing region, thereby increasing a thickness of an insulating layer at the crossing region between the first signal line and the second signal line without increasing a thickness of the array substrate. The array substrate effectively reduces a risk of short circuit between the first signal line and the second signal line, improves a product yield, and reduces the costs without affecting the performance of the array substrate.

It should be noted that, at the crossing region, the configuration that an orthographic projection of the second signal line 120 on the base substrate 100 completely falls into an orthographic projection of the groove 111 on the base substrate 100 includes: at the crossing region, the orthographic projection of the second signal line 120 on the base substrate 100 and the orthographic projection of the groove 111 on the base substrate 100 are completely overlapped, or the orthographic projection of the second signal line 120 on the base substrate 100 is a part of the orthographic projection of the groove 111 on the base substrate 100. In addition, the first direction and the second direction can be interchangeable, and the present embodiment is not limited thereto.

For example, the groove 111 can be disposed in the first signal line 110 located at at least one crossing region between the first signal line 110 and the second signal line 120. The present embodiment is described by taking a case where the groove 111 is disposed in the first signal line 110 at all crossing regions between the first signal line 110 and the second signal line 120 as an example, but is not limited thereto.

For example, one of the first signal line 110 and the second signal line 120 is a scanning line, and the other one of the first signal line 110 and the second signal line 120 is a data line; that is, the first signal line 110 is a scanning line, and the second signal line 120 is a data line, or the first signal line 110 is a data line, and the second signal line 120 is a scanning line. The present embodiment is not limited thereto.

For example, as illustrated by FIG. 2, in the array substrate, the first signal lines 110 and the second signal lines 120 cross each other to define a pixel unit in which the pixel electrode 160 is disposed. The array substrate further includes a thin film transistor including a gate electrode, a source electrode 151 and a drain electrode 152. The first signal line 110 is connected with the gate electrode to control opening and closing of the thin film transistor, and the second signal line 120 is connected with the source electrode 151. The pixel electrode 160 is connected with the drain electrode 152, and the second signal line 120 inputs a voltage signal required for displaying an image to the pixel electrode 160 through the thin film transistor to achieving displaying of a display panel including the array substrate. Herein, a case where the first signal line 110 is a scanning line, and the second signal line 120 is a data line is described as an example.

For example, a material of the base substrate 100 can be made of one or more materials selected from the group consisting of glass, polyimide, polycarbonate, polyacrylate, polyetherimide, and polyethersulfone. The present embodiment includes but is not limited thereto.

For example, a material of the first signal line 110 and the second signal line 120 can include one or more materials selected from the group consisting of copper, silver, aluminum, molybdenum, titanium, platinum, gold, and chromium, and the present embodiment is not limited thereto. For example, the material of the first signal line 110 and the second signal line 120 can further include one or a combination of ones selected from the group consisting of indium tin oxide, indium zinc oxide, zinc oxide, indium oxide, and indium gallium oxide.

Figure 3A:
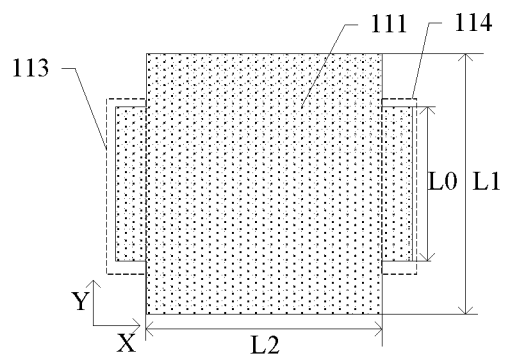
FIG. 3A is a partial schematic planar diagram of a groove and a first signal line nearby provided by an example of an embodiment of the present disclosure.

For example, FIG. 3A is a partial planar diagram of a groove and a first signal line nearby provided by an example of an embodiment of the present disclosure. As illustrated by FIG. 2 and FIG. 3A, the first signal line 110 further includes a first portion 112 and the second portion 115 which are located on two sides of the groove 111, the first portion 112 includes a first connection portion 113 connected with the groove 111, and the second portion 115 includes a second connection portion 114 connected with the groove 111. In the second direction, that is, the Y direction, a maximum size of the groove 111 is greater than a size of the first connection portion 113 and/or the second connection portion 114. For example, in the Y direction, upon the sizes of the first connection portion 113 and the second connection portion 114 being equal, the maximum size of the groove 111 is greater than the sizes of the first connection portion 113 and the second connection portion 114; in the Y direction, upon the sizes of the first connection portion 113 and the second connection portion 114 being different, the maximum size of the groove 111 is greater than the size of at least one selected from the group consisting of the first connection portion 113 and the second connection portion 114.

It should be noted that, FIG. 2 is a schematic diagram of the present embodiment, the first connection portion and the second connection portion are portions directly connected with the groove, and in the second direction, the size of the first connection portion can be smaller than a size of the first portion excluding the first connection portion, a size of the second connection portion can be smaller than a size of the second portion excluding the second connection portion. The present embodiment is not limited thereto. For example, in the second direction, the size of the first connection portion can be equal to a size of the first portion excluding the first connection portion, a size of the second connection portion can be equal to a size of the second portion excluding the second connection portion. Namely, in the second direction, other portions of the whole first signal line excluding the groove have the same size, which is smaller than that of the groove.

For example, as illustrated by FIG. 3A, it is assumed that a thickness perpendicular to the base substrate 100 of the first signal line 110 located at a position where the groove 111 is located is d, the resistivity is ρ, and a length in the X direction is L2, and a length in the Y direction is L1. Thus, the resistance of the first signal line 110 at the position where the groove 111 is located is $R=(\rho*L2)/(d*L1)$. The size of the first connection portion 113 and the second connection portion 114 directly connected to the two sides of the groove 111 in the Y direction is L0, and L1>L0. Although the thickness d of the first signal line 110 at the position where the groove 111 is located is reduced, L1 is increased, so that the resistance of the first signal line at the crossing region between the first signal line 110 and the second signal line 120 in FIG. 2 can remain substantially unchanged by adjusting the value of d*L1. It should be noted that, the present example is described by taking a case where a planar shape (i.e., an orthographic projection on the base substrate) of the groove is a regular rectangular shape as an example, but is not limited thereto.

Figure 3B:
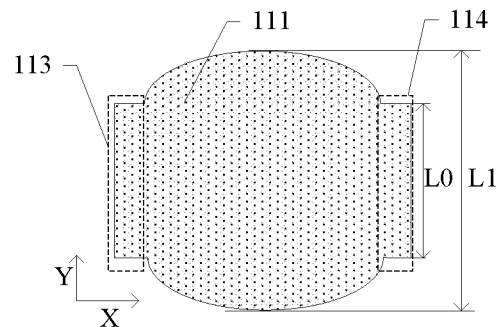
FIG. 3B is a partial planar diagram of a groove and a first signal line nearby provided by another example of an embodiment of the present disclosure.

For example, FIG. 3B is a partial planar diagram of a groove and a first signal line nearby according to another example of an embodiment of the present disclosure. As illustrated by FIG. 3B, the difference from FIG. 3A is that the planar shape (i.e., an orthographic projection on the base substrate) of the groove in the present example is not a regular rectangular shape, that is, an edge of the groove 111 extending in the X direction in the present example may not be a straight line, may be a curved type as illustrated by FIG. 3B, or may be a folded line type, and the present example is not limited thereto, as long as the maximum size of the groove 111 is greater than the size of the first connection portion 113 and/or the second connection portion 114 in the second direction to ensure the resistance of the first signal line 110 at the crossing region between the first signal line 110 and the second signal line 120 remain substantially unchanged with respect to the array substrate shown in FIG. 1.

Figure 4A:
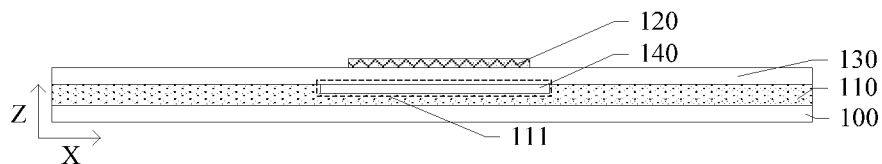
FIG. 4A is a partial sectional diagram of an array substrate provided by an example of an embodiment of the present disclosure.

For example, FIG. 4A is a partial sectional diagram of an array substrate according to an example of an embodiment of the present disclosure. As illustrated by FIG. 4A, the array substrate further includes a first insulating layer 130 between the first signal line 110 and the second signal line 120 to insulate the first signal line 110 and the second signal line 120 with each other, so as to prevent a short circuit (i.e., Data Gate Short, DGS) from occurring.

For example, a material of the first insulating layer 130 can include an inorganic material such as a metal oxide, a metal sulfide, or a metal nitride. The present embodiment is not limited thereto. For example, the material of the first insulating layer 130 can further include one or a combination of ones selected from the group consisting of polyimide, polyamide, polycarbonate, and epoxy resin.

For example, as illustrated by FIG. 4A, the array substrate provided in the present example further includes a second insulating layer 140 between the first signal line 110 and the second signal line 120, and the second insulating layer 140 in the present example is located between the first insulating layer 130 and the first signal line 110. An orthographic projection of the second insulating layer 140 on the base substrate 100 and an orthographic projection of the groove 111 on the base substrate 100 are completely overlapped with each other. In a direction perpendicular to the base substrate 100, that is, the Z direction, a thickness of the second insulating layer 140 is equal to a depth of the groove 111, so as to compensate a height difference generated by the groove 111 in the first signal line 110, that is, the second insulating layer 140 in the present example is used to fill the groove 111 to compensate the height difference between a surface of the first signal line 110 away from the base substrate 100 and the base substrate 100 due to the groove 111. With respect to the array substrate provided in FIG. 1, the thickness of the second insulating layer in the array substrate provided by the present example is an increased thickness of the insulating layer at the crossing region between the first signal line and the second signal line. Thus, the second insulating layer in the present example effectively reduces a risk of short circuit between the first signal line and the second signal line without increasing the thickness of the array substrate, thereby improving the product yield, and reducing the costs.

For example, the second insulating layer 140 can be made of the same material as the first insulating layer 130, or a material of the second insulating layer 140 is different from that of the first insulating layer 130, the present embodiment is not limited thereto.

Figure 4B:
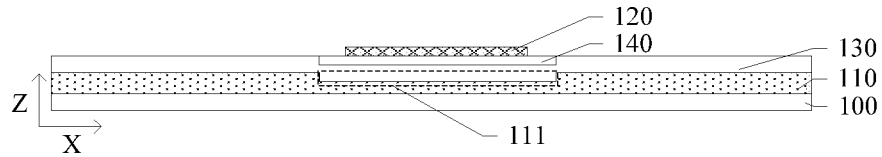
FIG. 4B is a partial sectional diagram of an array substrate provided by another example of an embodiment of the present disclosure.

For example, FIG. 4B is a partial sectional diagram of an array substrate provided by another example of an embodiment of the present disclosure. As illustrated by FIG. 4B, the difference from FIG. 4A is that the second insulating layer 140 in the present example is located between the first insulating layer 130 and the second signal line 120 to compensate a height difference of a surface of the first insulating layer 130 away from the base substrate 100 and the base substrate 100 due to the groove 111. That is, upon the first insulating layer 130 being directly located on a side of the first signal line 110 away from the base substrate 100, because the first signal line 110 is provided with the groove 111, the first insulating layer 130 located on the groove 111 is also formed with a concave portion in exactly the same shape and size as the groove 111, and the second insulating layer 140 located on a side of the first insulating layer 130 away from the base substrate 100 can be used to fill the concave groove in the first insulating layer 130, so as to eliminate the height difference of a surface of the first insulating layer 130 away from the base substrate 100 and the base substrate 100. Therefore, the thickness of the second insulating layer in the present example is an increased thickness of the insulating layer at the crossing region between the first signal line and the second signal line, and the second insulating layer effectively reduces a risk of short circuit between the first signal line and the second signal line without increasing the thickness of the array substrate, thereby improving the product yield, and reducing the costs.

For example, as illustrated by FIGS. 4A and 4B, in a direction perpendicular to the base substrate 100, a ratio of a depth of the groove 111 and a thickness of a portion of the first signal line 110 excluding the groove 111 is less than 1:2, that is, a ratio of the thickness of the first signal line 110 at the position where the groove 111 is located and the thickness of the portion of the first signal line 110 excluding the groove 111 is greater than 1:2, so as to prevent the first signal line 110 at the position where the groove 111 is located from occurring fracture.

Figure 5:
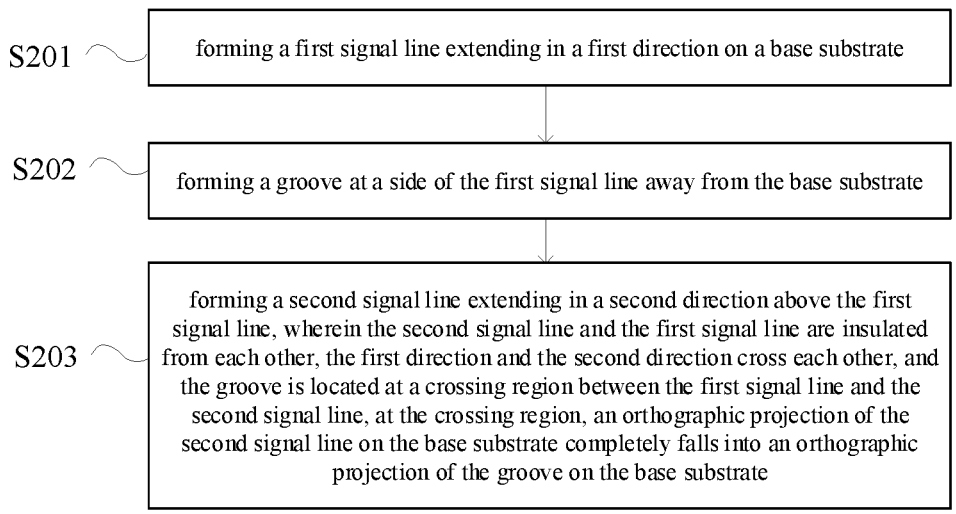
FIG. 5 is a schematic flow diagram of a manufacturing method of an array substrate provided by an embodiment of the present disclosure.

Another embodiment of the present disclosure provides a manufacturing method of an array substrate. FIG. 5 is a schematic flow diagram of a manufacturing method of an array substrate according to an embodiment of the present disclosure. As illustrated by FIG. 5, the manufacturing method includes the following steps.

S201: forming a first signal line extending in a first direction on a base substrate.

S202: forming a groove on a side of the first signal line away from the base substrate.

S203: forming a second signal line extending in a second direction above the first signal line, wherein the second signal line and the first signal line are insulated from each other, the first direction and the second direction cross each other, and the groove is located at a crossing region between the first signal line and the second signal line, at the crossing region, an orthographic projection of the second signal line on the base substrate completely falls into an orthographic projection of the groove on the base substrate.

It should be noted that, at the crossing region, the configuration that the orthographic projection of the second signal line on the base substrate completely falls into the orthographic projection of the groove on the base substrate includes: at the crossing region, the orthographic projection of the second signal line on the base substrate and the orthographic projection of the groove on the base substrate are completely overlapped, or the orthographic projection of the second signal line on the base substrate is only a part of the orthographic projection of the groove on the base substrate.

For example, a metal layer is formed on the base substrate, a photoresist pattern is formed on the metal layer, and the metal layer is patterned by using the photoresist pattern as a mask to form the first signal line. For example, a wet etching method can be employed to etch the metal layer to form the first signal line.

For example, the first signal line and the groove can be patterned by using different masks, that is, after the metal layer is patterned by using the photoresist pattern as a mask to form the first signal line, the photoresist is stripped, and then a subsequent process for forming the groove is performed.

For example, a groove can be formed in the first signal line at at least one crossing region between the first signal line and the second signal line, the present embodiment is described by taking a case where the groove is disposed in the first signal line at all crossing regions of the first signal line and the second signal line as an example, but is not limited thereto.

For example, one of the first signal line and the second signal line is a scanning line, and the other one of the first signal line and the second signal line is a data line, that is, the first signal line is a scanning line, the second signal line is a data line, or the first signal line is a data line, and the second signal line is a scanning line, the present embodiment is not limited thereto.

For example, in an example of the manufacturing method of the array substrate provided by the present embodiment, the step of forming the groove includes: forming a first insulating layer on the first signal line, that is, forming a first insulating layer on a side of the first signal line away from the base substrate; etching the first insulating layer at the crossing region by a location etching process to form a via hole to expose the first signal line, for example, a dry etching method can be employed to etch the first insulating layer at the crossing region to expose the first signal line at the crossing region; etching an exposed portion of the first signal line to form the groove, for example, the first signal line can be wet-etched with the etched first insulating layer as a mask to form the groove in the first signal line at the crossing region. Herein, after the first insulating layer is etched by a dry etching method, the first insulating layer can be prevented from being etched again by using a wet etching method to etch the first signal line.

For example, in the present example, before forming the second signal line, the manufacturing method further includes: filling the groove and the via hole with an insulating material. Herein, the groove is filled with an insulating material to form a second insulating layer, and a surface of the second insulating layer is flushed with a surface of the first signal line, that is, in a direction perpendicular to the base substrate, a thickness of the second insulating layer is equal to a depth of the groove, so as to compensate a height difference between a surface of the first signal line away from the base substrate and the base substrate due to the groove. And, the via hole of the first insulating layer is filled with the insulating material to make the thickness of the first insulating layer uniform, i.e., a surface of the insulating material filled in the via hole is flushed with a surface of the first insulating layer. Besides, after the via hole of the present example is filled with the insulating material, the insulating material can be regarded as a portion of the first insulating layer, and the portion and the first insulating layer obtained by the previous etching process constitute a complete first insulating layer. The second insulating layer in the present example is formed between the first signal line and the first insulating layer, as illustrated by FIG. 4A.

For example, the step of filling the groove and the via hole with the insulating material can include: forming an insulating material layer on the first insulating layer, and the groove and the via hole being filled by the insulating material layer, and after patterning the insulating material layer, etching and stripping the insulating material layer excluding the filling portion, so that a surface of the insulating material filled in the via hole is flushed with the surface of the first insulating layer, and the present embodiment includes but is not limited thereto.

In the manufacturing method of the array substrate provided in the present embodiment, a thickness of the first signal line at the crossing region between the first signal line and the second signal line is reduced, that is, a groove is disposed in the first signal line at the crossing region between the first signal line and the second signal line, so as to increase a distance between the first signal line and the second signal line at the crossing region, thereby increasing a thickness of the insulating layer at the crossing region between the first signal line and the second signal line without increasing a thickness of the array substrate. The manufacturing method of the array substrate effectively reduces a risk of short circuit between the first signal line and the second signal line, improves a product yield, and reduces the costs without affecting the performance of the array substrate.

The thickness of the second insulating layer formed in the manufacturing method of the array substrate provided by the abovementioned example is an increased thickness of the insulating layer at the crossing region between the first signal line and the second signal line, and therefore, without increasing the thickness of the array substrate, the second insulating layer in the present example plays a role of effectively reducing the risk of short circuit between the first signal line and the second signal line.

For example, the material of the first insulating layer can include an inorganic material such as a metal oxide, a metal sulfide or a metal nitride. The present embodiment is not limited thereto. For example, the material of the first insulating layer can further include one or a combination of more selected from the group consisting of polyimide, polyamide, polycarbonate, and epoxy resin.

For example, the second insulating layer in the present example can be made of the same material as the first insulating layer, or the second insulating layer can also be made of a material different from that of the first insulating layer, in this case, the first insulating layer can be made of two kinds of materials.

For example, in another example of the manufacturing method of the array substrate provided by the present embodiment, forming the groove includes: forming a photoresist pattern on the first signal line, for example, applying a photoresist on the first signal line, and performing a patterning process such as exposure and development to the photoresist to form the photoresist pattern, the photoresist pattern has the same shape with the first insulating layer being subjected to a localized etching process in the previous example; etching the first signal line by using the photoresist pattern as a mask to form the groove. For example, the photoresist pattern exposes the first signal line at the crossing region, and the exposed portion of first signal line is wet etched to form the desired groove.

For example, in the present example, before forming the second signal line, the manufacturing method further includes: filling the groove with an insulating material to form a second insulating layer, a surface of the second insulating layer being flushed with a surface of the first signal line, that is, in a direction perpendicular to the base substrate, a thickness of the second insulating layer is equal to a depth of the groove, so as to compensate a height difference between the surface of the first signal line away from the base substrate and the base substrate due to the groove; and forming a first insulating layer on the first signal line. In the present example, the second insulating layer is formed between the first signal line and the first insulating layer, as illustrated by FIG. 4A.

For example, in the present example, the second insulating layer can be made of the same material with the first insulating layer, or a material of the second insulating layer is different from that of the first insulating layer.

For example, in another example of the present embodiment, before forming the second signal line, the manufacturing method further includes: forming a first insulating layer on the first signal line, a portion of the first insulating layer which is located at the groove being formed as a concave portion, that is, the first insulating layer is directly formed on the first signal line, and a portion of the first insulating layer located on the groove has a concave portion; and filling the concave portion with an insulating material to form a second insulating layer. A surface of the second insulating layer is flushed with a surface of the first insulating layer, that is, the second insulating layer is located on a side of the first insulating layer away from the base substrate to compensate the height difference between the surface of the first insulating layer away from the base substrate and the base substrate due to the groove. In the present example, the second insulating layer is formed between the first insulating layer and the second signal line, as illustrated by FIG. 4B.

The second insulating layer formed by using any of the abovementioned methods can effectively reduce the risk of short circuit between the first signal line and the second signal line without increasing the thickness of the array substrate, thereby improving the product yield, and reducing the costs.

For example, the first signal line and the groove can also be patterned by using the same mask and formed by using a half tone mask process. For example, a metal layer is formed on the base substrate, a photoresist layer is formed on the metal layer, and then the photoresist layer is patterned by using a half tone mask process to form a photoresist layer having different thicknesses.

For example, a thickness H1 of the photoresist layer located directly above a position where the first signal line (excluding the groove) is to be formed is greater than a thickness H2 of the photoresist layer located directly above a position where the groove is to be formed, and the thickness H2 is greater than a thickness H3 of the photoresist layer located directly above a position where the first signal line is not formed. The photoresist layer having different thicknesses is processed by an ashing process and the first signal line with the groove can be patterned to reduce one mask process, and the embodiment includes but is not limited thereto. The steps for forming the first insulating layer and the second signal line after this are the same as those provided in the abovementioned examples, and are omitted herein.

For example, in the manufacturing method of the array substrate provided in the present embodiment, upon the first signal line being formed, the first signal line is subjected to a localized patterning process, so that a maximum size of the first signal line at a position where the groove to be etched in the following processes in the second direction is slightly greater than a size of a portion of the first signal line connected to two sides of the groove in the second direction, that is, the first signal line further includes a first portion and a second portion which are located on two sides of the groove, and the first portion includes a first connection portion connected with the groove, the second portion includes a second connection portion connected with the groove, in the second direction, a maximum size of the first signal line at the position where the groove is to be formed is greater than a size of the first connection portion and/or the second connection portion. Therefore, although the thickness of the first signal line at the position where the groove is located is decreased in a direction perpendicular to the base substrate, a size in the second direction is increased, and thus the resistance of the first signal line at the crossing region between the first signal line and the second signal line can remain substantially unchanged with respect to the array substrate illustrated by FIG. 1 by adjusting the value of the size in the second direction and the thickness of the first signal line at the position where the groove is located.

For example, a shape of an orthographic projection of the groove on the base substrate can be a regular shape such as a regular rectangular shape, or an irregular shape, the present embodiment is not limited thereto.

For example, in a direction perpendicular to the base substrate, a ratio of a depth of the groove and a thickness of a portion of the first signal line excluding the groove is less that 1:2, that is, the ratio of the thickness of the first signal line at the position where the groove is located and the thickness of the portion of the first signal line excluding the groove is greater than 1:2, so as to prevent the first signal line at the position where the groove located from occurring fracture.

Another embodiment of the present disclosure provides a display device, including the array substrate provided by any one of the above embodiments. In the display device including the array substrate, the thickness of the first signal line at a crossing region between the first signal line is reduced, that is, a groove is disposed in the first signal line at the crossing region between the first signal line and the second signal line, so as to increase a distance between the first signal line and the second signal line at the crossing region, thereby increasing a thickness of an insulating layer at the crossing region between the first signal line and the second signal line without increasing a thickness of the array substrate. The display device effectively reduces a risk of short circuit between the first signal line and the second signal line, improves a product yield, and reduces the costs without affecting the performance of the array substrate.

For example, the display device can be a display device such as a liquid crystal display device, an organic light-emitting diode (OLED) display device, and any product or component having a display function, such as a television, a digital camera, a mobile phone, a watch, a tablet computer, a notebook computer, and a navigation device that including the display device.

The following points should to be explained:

(1) Unless otherwise defined, in the embodiments and accompanying drawings in the present disclosure, the same reference numeral represents the same meaning.

(2) The accompanying drawings involve only the structure(s) in connection with the embodiment(s) of the present disclosure, and other structure(s) can be referred to common design(s).

(3) For the purpose of clarity, in accompanying drawings for illustrating the embodiment(s) of the present disclosure, layer(s) or region(s) may be enlarged. However, it should understood that, in the case in which a component or element such as a layer, film, region, substrate or the like is referred to be "on" or "under" another component or element, it may be directly on or under the another component or element or a component or element is interposed therebetween.

The foregoing is only the embodiments of the present disclosure and not intended to limit the scope of protection of the present disclosure, alternations or replacements which can be easily envisaged by any skilled person being familiar with the present technical field shall fall into the protection scope of the present disclosure. Thus, the protection scope of the present disclosure should be based on the protection scope of the claims.

What is claimed is:

1. An array substrate, comprising:
    a base substrate;
    a first signal line, extending in a first direction and located on the base substrate;
    a second signal line, extending in a second direction, located on a side of the first signal line away from the base substrate, and insulated with the first signal line, the first direction and the second direction crossing with each other,
    wherein a side of the first signal line facing the second signal line is provided with a groove, the groove is located at a crossing region between the first signal line and the second signal line, at the crossing region, an orthographic projection of the second signal line on the base substrate completely falls into an orthographic projection of the groove on the base substrate.

2. The array substrate according to claim 1, wherein the first signal line further comprises a first portion and a second portion which are located on two sides of the groove, the first portion comprises a first connection portion connected with the groove, the second portion comprises a second connection portion connected with the groove, in the second direction, a maximum size of the groove is greater than a size of at least one selected from the group consisting of the first connection portion and the second connection portion.

3. The array substrate according to claim 1, further comprising:
    a first insulating layer, located between the first signal line and the second signal line.

4. The array substrate according to claim 3, further comprising:
    a second insulating layer, located between the first signal line and the second signal line,
    wherein an orthographic projection of the second insulating layer on the base substrate and an orthographic projection of the groove on the base substrate are completely overlapped, in a direction perpendicular to the base substrate, a thickness of the second insulating layer is equal to a depth of the groove, so as to compensate a height difference between a surface of the first signal line or the first insulating layer away from the base substrate and the base substrate due to the groove.

5. The array substrate according to claim 4, wherein the second insulating layer is located between the first insulating layer and the first signal line, or between the first insulating layer and the second signal line.

6. The array substrate according to claim 1, wherein, in a direction perpendicular to the base substrate, a ratio of a depth of the groove and a thickness of a portion of the first signal line excluding the groove is less than 1:2.

7. The array substrate according to claim 1, wherein one of the first signal line and the second signal line is a scanning line, and the other one of the first signal line and the second signal line is a data line.

8. A display device, comprising the array substrate according to claim 1.

9. A manufacturing method of an array substrate, comprising:
    forming a first signal line extending in a first direction on a base substrate;
    forming a groove at a side of the first signal line away from the base substrate;
    forming a second signal line extending in a second direction above the first signal line, the second signal line and the first signal line being insulated with each other, the first direction and the second direction crossing with each other,
    wherein the groove is located at a crossing region between the first signal line and the second signal line, at the crossing region, an orthographic projection of the second signal line on the base substrate completely falls into an orthographic projection of the groove on the base substrate.

10. The manufacturing method of the array substrate according to claim 9, wherein forming the groove comprises:
   forming a first insulating layer on the first signal line;
   etching the first insulating layer at the crossing region to form a via hole to expose the first signal line; and
   etching an exposed portion of the first signal line to form the groove.

11. The manufacturing method of the array substrate according to claim 10, wherein, before forming the second signal line, the manufacturing method further comprises:
   filling the groove and the via hole with an insulating material, wherein the groove is filled with the insulating material to form a second insulating layer, a surface of the second insulating layer is flushed with a surface of the first signal line, and the via hole is filled with the insulating material to make a thickness of the first insulating layer uniform.

12. The manufacturing method of the array substrate according to claim 9, wherein forming the groove comprises:
   forming a photoresist pattern on the first signal line; and
   etching the first signal line by using the photoresist pattern as a mask to form the groove.

13. The manufacturing method of the array substrate according to claim 12, wherein, before forming the second signal line, the manufacturing method further comprises:
   filling the groove with an insulating material to form a second insulating layer, a surface of the second insulating layer being flushed with a surface of the first signal line; and
   forming a first insulating layer on the first signal line and the second insulating layer.

14. The manufacturing method of the array substrate according to claim 10, wherein the first signal line further comprises a first portion and a second portion which are located on two sides of the groove, the first portion comprises a first connection portion connected with the groove, the second portion comprises a second connection portion connected with the groove, wherein, forming the first signal line comprises:
   patterning the first signal line to make a maximum size of the first signal line at a position where the groove is to be formed greater than a size of at least one selected from the group consisting of the first connection portion and the second connection portion in the second direction.

15. The manufacturing method of the array substrate according to claim 9, wherein the first signal line and the groove are patterned by one mask plate, and formed by a half tone mask process.

16. The manufacturing method according to claim 12, wherein, before forming the second signal line, the manufacturing method further comprises:
   forming a first insulating layer on the first signal line, a portion of the first insulating layer which is located at the groove being formed as a concave portion; and
   filling the concave portion with an insulating material to form a second insulating layer, a surface of the second insulating layer being flushed with a surface of the first insulating layer.

17. The manufacturing method of the array substrate according to claim 9, wherein, in a direction perpendicular to the base substrate, a ratio of a depth of the groove and a thickness of a portion of the first signal line excluding the groove is less than 1:2.

* * * * *